(12) United States Patent
Cho et al.

(10) Patent No.: US 9,543,275 B2
(45) Date of Patent: Jan. 10, 2017

(54) SEMICONDUCTOR PACKAGE WITH A LEAD, PACKAGE-ON-PACKAGE DEVICE INCLUDING THE SAME, AND MOBILE DEVICE INCLUDING THE SAME

(71) Applicants: Yun-rae Cho, Suwon-si (KR); Jong-oh Kwon, Suwon-si (KR)

(72) Inventors: Yun-rae Cho, Suwon-si (KR); Jong-oh Kwon, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/732,653

(22) Filed: Jun. 5, 2015

(65) Prior Publication Data
US 2016/0079206 A1 Mar. 17, 2016

(30) Foreign Application Priority Data
Sep. 11, 2014 (KR) .................. 10-2014-0120206

(51) Int. Cl.
*H01L 25/10* (2006.01)
*H01L 25/065* (2006.01)
(Continued)

(52) U.S. Cl.
CPC ......... *H01L 25/0657* (2013.01); *H01L 25/105* (2013.01); *H01L 25/50* (2013.01); *H01L 23/3128* (2013.01); *H01L 2224/02381* (2013.01); *H01L 2224/0401* (2013.01); *H01L 2224/04042* (2013.01); *H01L 2224/04073* (2013.01); *H01L 2224/05569* (2013.01); *H01L 2224/16145* (2013.01); *H01L 2224/16227* (2013.01); *H01L 2224/1703* (2013.01);
(Continued)

(58) Field of Classification Search
CPC .............. H01L 23/48; H01L 23/49575; H01L 23/49503; H01L 23/49541; H01L 25/0657; H01L 23/3128; H01L 25/105; H01L 2225/06513; H01L 2225/0651; H01L 2225/06524; H01L 2225/1011; H01L 2924/3511; H01L 2924/18161; H01L 2924/1816
USPC .............. 257/777, 686, 685, 723, 778, 737, 738,257/734, 784, 786, 707, 704, 711
See application file for complete search history.

(56) References Cited

U.S. PATENT DOCUMENTS 5,726,079 A 3/1998 Johnson
6,448,665 B1 9/2002 Nakazawa et al.
(Continued)

FOREIGN PATENT DOCUMENTS

JP 2002110851 A 4/2002
KR 100400826 A 10/2003
(Continued)

*Primary Examiner* — Alexander Oscar Williams
(74) *Attorney, Agent, or Firm* — Renaissance IP Law Group LLP

(57) ABSTRACT

A semiconductor package includes a substrate; a first semiconductor chip arranged on the substrate; a second semiconductor chip arranged on the first semiconductor chip; a lead attached to the second semiconductor chip on a side of the second semiconductor chip opposite a side of the second semiconductor chip facing the first semiconductor chip; and a molding member covering an upper surface of the substrate and side surfaces of the lead and sealing the first semiconductor chip and the second semiconductor chip.

5 Claims, 12 Drawing Sheets

(51) Int. Cl.
  *H01L 23/48*  (2006.01)
  *H01L 25/00*  (2006.01)
  *H01L 23/31*  (2006.01)

(52) U.S. Cl.
  CPC ............ *H01L 2224/17051* (2013.01); *H01L 2224/17181* (2013.01); *H01L 2224/48091* (2013.01); *H01L 2224/48227* (2013.01); *H01L 2224/73207* (2013.01); *H01L 2224/73253* (2013.01); *H01L 2224/73265* (2013.01); *H01L 2224/92163* (2013.01); *H01L 2224/92247* (2013.01); *H01L 2225/0651* (2013.01); *H01L 2225/06513* (2013.01); *H01L 2225/1023* (2013.01); *H01L 2225/1058* (2013.01); *H01L 2924/15311* (2013.01); *H01L 2924/1816* (2013.01); *H01L 2924/18161* (2013.01); *H01L 2924/3511* (2013.01)

(56) References Cited

U.S. PATENT DOCUMENTS

| | | |
|---|---|---|
| 6,798,049 B1 | 9/2004 | Shin et al. |
| 6,982,488 B2 | 1/2006 | Shin et al. |
| 7,064,444 B2 | 6/2006 | Lee et al. |
| 7,211,900 B2 | 5/2007 | Shin et al |
| 8,624,377 B2 | 1/2014 | Liou et al. |
| 2005/0275080 A1 | 12/2005 | Chung |
| 2009/0045423 A1* | 2/2009 | Hashimoto ............ H01L 33/60 257/98 |
| 2010/0044852 A1* | 2/2010 | Kwon ................... H01L 23/552 257/690 |
| 2011/0309526 A1* | 12/2011 | Cho ....................... H01L 21/563 257/777 |
| 2012/0273959 A1* | 11/2012 | Park ........................ H01L 24/97 257/774 |
| 2013/0320518 A1* | 12/2013 | Chun ..................... H01L 23/34 257/712 |
| 2014/0084416 A1* | 3/2014 | Kang ..................... H01L 23/50 257/532 |
| 2014/0127863 A1 | 5/2014 | Lin et al. |
| 2014/0210109 A1* | 7/2014 | Tanaka ................ H01L 23/3135 257/778 |
| 2014/0239434 A1* | 8/2014 | Kim ..................... H01L 25/105 257/467 |
| 2014/0327129 A1* | 11/2014 | Cho ..................... H01L 23/3675 257/713 |
| 2015/0061095 A1* | 3/2015 | Choi ........................ H01L 24/20 257/675 |
| 2015/0200186 A1* | 7/2015 | Park ..................... H01L 25/0657 257/774 |
| 2015/0206869 A1* | 7/2015 | Kim ....................... H01L 23/36 438/109 |
| 2015/0221625 A1* | 8/2015 | Chun ..................... H01L 25/18 257/707 |
| 2015/0357269 A1* | 12/2015 | Im ..................... H01L 23/49575 257/675 |
| 2016/0005714 A1* | 1/2016 | Lee ..................... H01L 25/0652 257/777 |

FOREIGN PATENT DOCUMENTS

| | | |
|---|---|---|
| KR | 20050048900 A | 5/2005 |
| KR | 101011840 B1 | 1/2011 |
| KR | 101115714 A | 3/2012 |

* cited by examiner

SEMICONDUCTOR PACKAGE WITH A LEAD, PACKAGE-ON-PACKAGE DEVICE INCLUDING THE SAME, AND MOBILE DEVICE INCLUDING THE SAME

CROSS-REFERENCE TO RELATED APPLICATION

This application claims the benefit of Korean Patent Application No. 10-2014-0120206, filed on Sep. 11, 2014, in the Korean Intellectual Property Office, the disclosure of which is incorporated herein in its entirety by reference.

BACKGROUND

Embodiments relate to a semiconductor package, a package-on-package (PoP) device including the same, and a mobile device including the same, and more particularly, to a semiconductor package having a structure that prevents deformation of a semiconductor chip, a package-on-package device including the semiconductor package, and a mobile device including the same.

Recently, as demand for miniaturized mobile devices has increased, small, thin, and light semiconductor devices have been developed. Accordingly, a semiconductor package including a plurality of semiconductor chips has been developed. For example, the semiconductor package may have a chip-on-chip (CoC) structure in which two or more semiconductor chips are stacked or a package-on-package (PoP) structure in which two or more semiconductor packages are stacked. In this case, an entire thickness of the semiconductor package may increase, however, when thicknesses of the mounted semiconductor chips are decreased in order to address this problem, the semiconductor chips may be deformed. Thus, deterioration of an electrical connection in the semiconductor package may occur.

SUMMARY

An embodiment includes a semiconductor package includes a substrate; a first semiconductor chip arranged on the substrate; a second semiconductor chip arranged on the first semiconductor chip; a lead attached to the second semiconductor chip on a side of the second semiconductor chip opposite a side of the second semiconductor chip facing the first semiconductor chip; and a molding member covering an upper surface of the substrate and side surfaces of the lead and sealing the first semiconductor chip and the second semiconductor chip.

An embodiment includes a package-on-package device comprising: a memory package comprising: a first semiconductor chip arranged on a substrate; a second semiconductor chip arranged on the first semiconductor chip; a lead attached to the second semiconductor chip on a side of the second semiconductor chip opposite a side of the second semiconductor chip facing the first semiconductor chip; and a molding member covering an upper surface of the substrate and side surfaces of the lead and sealing the first semiconductor chip and the second semiconductor chip; a system semiconductor package comprising a logic chip arranged on a system semiconductor substrate; and a semiconductor package having a structure in which the memory package and the system semiconductor package are stacked.

An embodiment includes a semiconductor package comprising: a substrate; a first semiconductor chip stacked on the substrate; a second semiconductor chip stacked on the first semiconductor chip and electrically coupled to the first semiconductor chip; a molding member disposed between the first semiconductor chip and the second semiconductor chip; and a lead stacked on the second semiconductor chip on a side of the second semiconductor chip opposite the molding member.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1A:
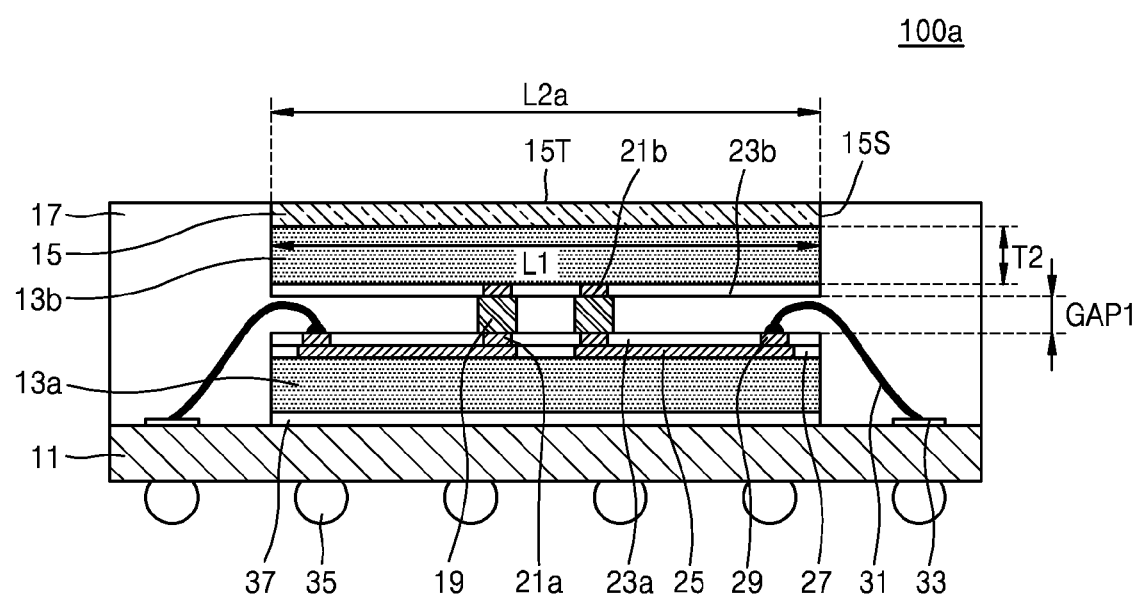
FIGS. 1A to 5 are cross-sectional views of semiconductor packages according to some embodiments.

The attached drawings for illustrating exemplary embodiments are referred to in order to gain a sufficient understanding, the merits thereof, and the objectives accomplished by the implementation. Embodiments may, however, take many different forms and should not be construed as being limited to the particular embodiments set forth herein; rather, these embodiments are provided so that this disclosure will be thorough and complete, and will fully convey the concept to those skilled in the art. In the drawings, the thicknesses of layers and regions are exaggerated for clarity.

It will be understood that when a component, such as a layer, a film, a region, or a plate, is referred to as being "on" or "connected to" another component, the component can be directly on or connected to the other component or intervening components may be present thereon. When a component is referred to as being "directly on" or "directly connected to" another component, intervening components may not be present thereon. The above expressions may encompass other expressions which describe relations between components, for example, "between", "directly-~between", or the like.

While such terms as "first", "second", etc., may be used to describe various components, such components must not be limited to the above terms. The above terms are used only to distinguish one component from another. Thus, a first element discussed below could be termed a second element, and similarly, a second element may be termed a first element without departing from the teachings of this disclosure.

An expression used in the singular encompasses the expression of the plural, unless it has a clearly different meaning in the context. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms used herein have the same meaning as commonly understood by one of ordinary skill in the art.

Hereinafter, embodiments will be described in detail by explaining exemplary embodiments with reference to the attached drawings. Like reference numerals in the drawings denote like elements.

FIG. 1A is a cross-sectional view of a semiconductor package 100a according to an embodiment. Referring to FIG. 1A, the semiconductor package 100a may include a substrate 11, a first semiconductor chip 13a arranged on the substrate 11, a second semiconductor chip 13b arranged on the first semiconductor chip 13a, a lead 15 attached onto the second semiconductor chip 13b in order to prevent deformation thereof, for example, bending or warpage of the second semiconductor chip 13b, and a molding member which covers an upper surface of the substrate 11 and side surfaces 15S of the lead 15 and seals the first and second semiconductor chips 13a and 13b.

In detail, the substrate 11 may be a printed circuit board (PCB), an organic substrate, an inorganic substrate, a glass substrate, a flexible substrate, or the like. Substrate bonding pads 33 may be formed on the upper surface of the substrate 11. The substrate bonding pads 33 are connected to internal wires (not shown) of the substrate 11, and the internal wires may be electrically connected to solder balls 35 formed on a lower surface of the substrate 11. A conductive pattern (not shown) may be formed between the solder balls 35 and the internal wires. The solder balls 35 may be electrically connected to an external device (not shown). The substrate 11 may include an insulating material layer and a metal layer. The first semiconductor chip 13a may be arranged on areas of the substrate 11 where the substrate bonding pads 33 are not formed. The first semiconductor chip 13a may be bonded to the substrate 11 through a bonding layer 37. In this case, an entire lower surface of the first semiconductor chip 13a may be bonded to the upper surface of the substrate 11 by interposing the bonding layer 37 between the first semiconductor chip 13a and the substrate 11. Since the entire lower surface of the first semiconductor chip 13a is bonded to the upper surface of the substrate 11, deformation of the first semiconductor chip 13a may be prevented due to the support of the substrate 11.

Chip bonding pads 29 may be formed on the first semiconductor chip 13a. The chip bonding pads 29 may be electrically connected through wires 31 to the substrate bonding pads 33 formed on the substrate 11. The chip bonding pads 29 are terminals via which electrical signals input/output to/from an internal circuit (not shown) of the first semiconductor chip 13a pass, and may be exposed by an insulating layer 23a. The chip bonding pads 29 may be arranged adjacent to edges of the first semiconductor chip 13a.

The first semiconductor chip 13a may be electrically connected to the second semiconductor chip 13b by conductive members, for example, conductive bumps 19. In this case, an active surface of the first semiconductor chip 13a may face an active surface of the second semiconductor chip 13b. The active surfaces may respectively be surfaces of a substrate forming the first semiconductor chip 13a (not shown) and of a substrate forming the second semiconductor chip 13b in which internal circuits are formed. That is, the active surface of the first semiconductor chip 13a may be arranged on the substrate 11 to face the active surface of the second semiconductor chip 13b. The active surface of the second semiconductor chip 13b may be arranged on the first semiconductor chip 13a to face the active surface of the first semiconductor chip 13a. In this case, the conductive bumps 19 are arranged between the first semiconductor chip 13a and the second semiconductor chip 13b so that the internal circuit of the first semiconductor chip 13a and that of the second semiconductor chip 13b are connected to each other. According to a method of directly connecting a gap between the first semiconductor chip 13a and the second semiconductor chip 13b through the conductive bumps 19, a length of a wire connecting the first semiconductor chip 13a and the second semiconductor chip 13b is decreased, and thus, circuits of the semiconductor package 100a may operate at an increased speed.

A first pad layer including first bump pads 21a and the insulating layer 23a limiting the first bump pads 21a may be formed on the active surface of the first semiconductor chip 13a. The conductive bumps 19 may be connected to the first bump pads 21a. Although it is illustrated that the chip bonding pads 29, the first bump pads 21a, and the insulating layer 23a are formed to have the same level, other embodiments are not limited thereto. The chip bonding pads 29 and the first bump pads 21a may be formed to have different levels. In some embodiments, the chip bonding pads 29 and the first bump pads 21a may be omitted.

The first bump pads 21a may be arranged in a center of the first semiconductor chip 13a. In some embodiments, locations of the first bump pads 21a may be determined according to Joint Electron Device Engineering Council (JEDEC) Standards. In this case, a first redistribution layer including first redistribution lines 25 and an insulating layer 27 limiting the first redistribution lines 25 may be further formed on the first semiconductor chip 13a so that the first bump pads 21a, which are formed in the center of the first semiconductor chip 13a, are electrically connected to the chip bonding pads 29 which are formed on the edges of the first semiconductor chip 13a. The first redistribution lines 25 may electrically connect the first bump pads 21a, which are connected to the conductive bumps 19, and the chip bonding pads 29 which are connected to the wires 31. Although it is illustrated that the insulating layer 23a limiting the first bump pads 21a and the insulating layer 27 limiting the first redistribution lines 25 are formed to have different levels, the inventive concept is not limited thereto. The insulating layer 23a and the insulating layer 27 may be integrally formed or may be formed separately from the same material.

A second pad layer including second bump pad 21b and an insulating layer 23b limiting the second bump pad 21b may be formed on the active surface of the second semiconductor chip 13b. The conductive bumps 19 may be connected to the second bump pad 21b. In this case, like the first bump pads 21a formed on the first semiconductor chip 13a, the second bump pad 21b may be formed in a center of the second semiconductor chip 13b. In some embodiments, the second bump pad 21b may be omitted.

The first bump pads 21a and the second bump pad 21b may be respectively arranged in the centers of the first semiconductor chip 13a and the second semiconductor chip 13b in order to decrease areas of the first semiconductor chip 13a and the second semiconductor chip 13b, but embodiments are not limited thereto. As an arrangement of the first bump pads 21a and the second bump pad 21b may be adjusted according to a redistribution structure such as the first redistribution lines 25, a degree of freedom for designing the semiconductor package 100a may be increased.

The lead 15, configured to prevent the deformation of the second semiconductor chip 13b, is arranged on an upper surface of the second semiconductor chip 13b. The second semiconductor chip 13b is connected to the first semiconductor chip 13a through the conductive bumps 19. Therefore, the second semiconductor chip 13b may be deformed because only a portion of a lower surface of the second semiconductor chip 13b is supported. Accordingly, the second semiconductor chip 13b may be deformed in a subsequent process, and in particular, a deformation, such as warpage, of the second semiconductor chip 13b may occur. In this case, since the second semiconductor chip 13b and the conductive bumps 19 are disconnected, the performance of the semiconductor package may be degraded. Therefore, a thickness of the second semiconductor chip 13b may be increased to prevent the deformation of the second semiconductor chip 13b. However, the thickness of the semiconductor package may be decreased to a certain thickness according to demand for miniaturizing the semiconductor package, and thus, it may be difficult to increase the thickness of the second semiconductor chip 13b to prevent the deformation of the second semiconductor chip 13b.

Accordingly, the deformation of the second semiconductor chip 13b may be reduced or prevented by attaching the lead 15 to the second semiconductor chip 13b. In some embodiments, the lead 15 may be formed to completely cover the upper surface of the second semiconductor chip 13b. Therefore, a width L1 of the second semiconductor chip 13b may be substantially the same as a width L2a of the lead 15. Also, an area of the second semiconductor chip 13b may be the same as that of the lead 15. The lead 15 supports the second semiconductor chip 13b so as to prevent the deformation of the second semiconductor chip 13b, and the width L2a of the lead 15 is not limited. The width L2a of the lead 15 will be described with reference to FIGS. 1B and 1C. The lead 15 may include a material having a greater strength than a material of the second semiconductor chip 13b in order to support the second semiconductor chip 13b. Also, the lead 15 may protect the second semiconductor chip 13b from an external physical or chemical impact. Since the lead 15 supports the second semiconductor chip 13b, materials for forming the lead 15 are not limited to a certain material. In some embodiments, the lead 15 may include at least one of conductive materials, such as a metal, and insulating materials. In an embodiment, the material of the lead 15 may result in the lead 15 being more rigid than the second semiconductor chip 13b.

The molding member 17 is formed to protect components of the semiconductor package 100a, for example, the first semiconductor chip 13a, the second semiconductor chip 13b, etc. The molding member 17 covers the upper surface of the substrate 11 and the side surfaces 15S of the lead 15 and seals the first semiconductor chip 13a, the second semiconductor chip 13b, the wires 31, the conductive bumps 19, etc. In this case, the molding member 17 may expose an upper surface 15T of the lead 15. Accordingly, since the molding member 17 is not formed on the upper surface 15T of the lead 15, the thickness of the semiconductor package 100a may remain thin although the lead 15 is formed.

In detail, the semiconductor package 100a may be a Chip-On-Chip (CoC) package, and thus, a thickness thereof may be limited due to the demand for miniaturizing a semiconductor package. In particular, when the semiconductor package 100a needs to be included in the CoC semiconductor package, a limitation on the thickness of the semiconductor package 100a may be increased. A gap GAP1 between the first semiconductor chip 13a and the second semiconductor chip 13b may be decreased in order to meet a limitation condition regarding a thickness of a semiconductor package. However, since the wires 31 are arranged within the gap GAP1 in a loop shape, reducing the gap GAP1 is limited to a certain height that may accommodate the vertical rise of the wires 31. Therefore, the thicknesses of the first semiconductor chip 13a and the second semiconductor chip 13b may be decreased to meet the limitation condition regarding a thickness of a semiconductor package. Since an entire lower surface of the first semiconductor chip 13a is bonded to the substrate 11 by the bonding layer 37, the deformation of the first semiconductor chip 13a may be prevented although the thickness of the first semiconductor chip 13a is decreased. However, since partially supported by the conductive bumps 19, the second semiconductor chip 13b may be deformed. Therefore, when the thickness of the second semiconductor chip 13b is decreased, deformation such as bending may occur, and thus, an electrical connection of the second semiconductor chip 13b may have defects. Therefore, the molding member 17 may expose the upper surface 15T of the lead 15 in order to decrease the thickness of the semiconductor package 100a, which has been increased because the lead 15 supporting the second semiconductor chip 13b is formed on the upper surface of the second semiconductor chip 13b. Since the upper surface of the second semiconductor chip 13b may be protected by the lead 15, the lead 15 may perform the function of the molding member 17. Also, a space obtained by not forming the molding member 17 on the second semiconductor chip 13b is used to increase the thickness of the lead 15 or the second semiconductor chip 13b. That is, the lead 15 may be disposed in a location that may otherwise have been occupied by the molding member 17. Thus, the deformation of the second semiconductor chip 13b may be reduced or prevented.

The first semiconductor chip 13a and the second semiconductor chip 13b may be memory semiconductor chips. In some embodiments, the first semiconductor chip 13a and/or the second semiconductor chip 13b may be dynamic random access memory (DRAM), static random access memory (SRAM), phase-change random access memory (PRAM), magnetoresistive random access memory (MRAM), ferroelectric random access memory (FeRAM), Resistive Random Access Memory (RRAM), flash memory, or electrically erasable programmable read-only memory (EEPROM). In some embodiments, the first semiconductor chip 13a and/or the second semiconductor chip 13b may perform a data transmission method such as, for example, single data rate (SDR), double data rate (DDR), quadruple data rate (QDR), low power DDR (LPDDR), LPDDR2, LPDDR3, LPDDR4, higher data rate techniques, or the like. In some embodiments, the first semiconductor chip 13a and/or the second semiconductor chip 13b may be mobile DRAM. Accordingly, the semiconductor package 100a may be used in a mobile device as a memory package. In some embodiments, the first semiconductor chip 13a and the second semiconductor chip 13b may be system semiconductor chips.

In some embodiments, the semiconductor package 100a has a thickness ranging from 240 μm about to about 280 μm, and a sum of the thickness of the second semiconductor chip 13b and that of the lead 15 may range from 80 μm about to about 140 μm. In some embodiments, the thickness of the lead 15 may be about 20 μm.

Figure 1B:
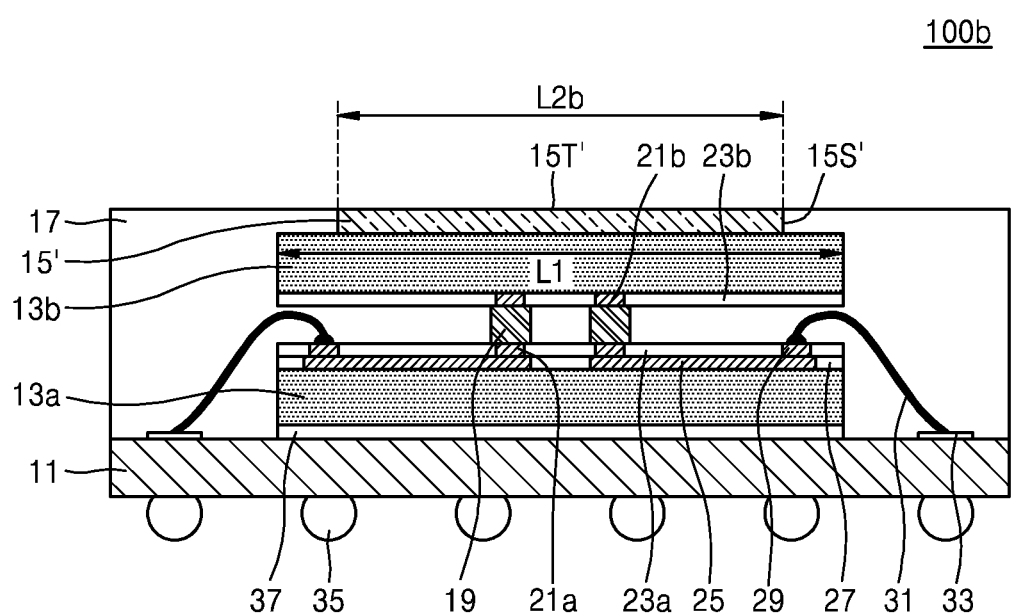

FIG. 1B is a cross-sectional view of the semiconductor package 100b according to an embodiment. The semiconductor package 100b is similar to the semiconductor package 100a of FIG. 1A except for a width L2b of a lead 15'.

Referring to FIG. 1B, the width L2b of the lead 15' may be less than the width L1 of the second semiconductor chip 13b. The molding member 17 may cover a portion of an edge of the upper surface of the second semiconductor chip 13b and side surfaces 15S' of the lead 15'. An area of the lead 15' may be less than that of the second semiconductor chip 13b. Although the lead 15' has been illustrated as not extending to the edge of the second semiconductor chip 13b, in some embodiments, the lead 15' may extend to some but not all of the edges of the second semiconductor chip 13b.

Figure 1C:
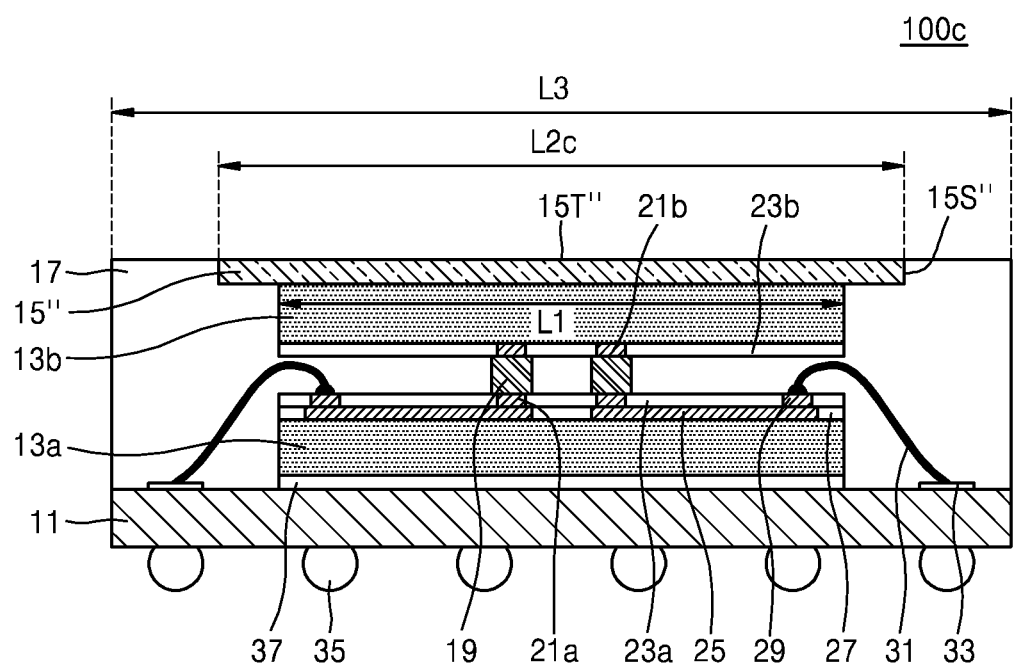

FIG. 1C is a cross-sectional view of the semiconductor package 100c according to an embodiment. The semiconductor package 100c is similar to the semiconductor package 100a of FIG. 1A except for a width L2c of a lead 15''. Referring to FIG. 1C, the width L2c of the lead 15'' may be greater than the width L1 of the second semiconductor chip 13b. The molding member 17 may cover a portion of an edge on the lower surface of the lead 15''. In this case, the width L2c of the lead 15'' is smaller than the width L3 of the molding member 17, and thus, the side surfaces 15S'' of the lead 15'' may be protected by the molding member 17. An area of the lead 15'' may be greater than that of the second semiconductor chip 13b. In some embodiments, the lead 15'' may extend over some edges of the second semiconductor chip 13b, but also may not extend to other edges similar to the lead 15' of FIG. 1B, extend to other edges similar to the lead 15 of FIG. 1A, or the like.

Figure 2:
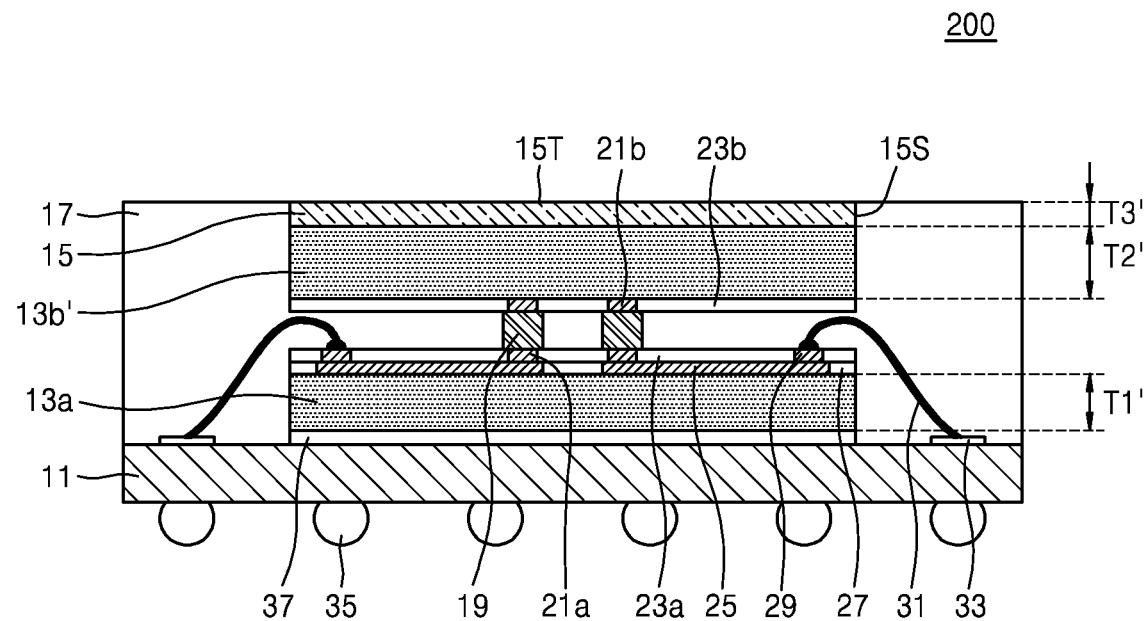

FIG. 2 is a cross-sectional view of the semiconductor package 200 according to an embodiment. The semiconductor package 200 is similar to the semiconductor package 100a of FIG. 1A except for a thickness T2' of a second semiconductor chip 13b'. Referring to FIG. 2, a space obtained by exposing the upper surface 15T of the lead 15 via the molding member 17 may be used to form the lead 15 or increase the thickness T2' of the second semiconductor chip 13b'. Accordingly, the thickness T2' of the second semiconductor chip 13b' of the semiconductor package 200 may be greater than the thickness T2 of the second semiconductor chip 13b' of the semiconductor package 100a of FIG. 1A. Also, the thickness T2' of the second semiconductor chip 13b' may be greater than the thickness T1' of the first semiconductor chip 13a. In some embodiments, the space, which is secured because the molding member 17 exposes the upper surface 15T of the lead 15, may be used to increase the thickness T3' of the lead 15. In some embodiments, the thickness T1' of the first semiconductor chip 13a may be less than a sum of the thickness T2' of the second semiconductor chip 13b' and the thickness T3' of the lead 15. The space obtained by exposing the upper surface 15T of the lead 15 via the molding member 17 may be used to increase any one of the thickness T2' of the second semiconductor chip 13b' and the thickness T3' of the lead 15.

The thickness of the semiconductor package 200 may be determined according to types or purposes of the semiconductor package 200. Also, thicknesses of the lead 15 and the second semiconductor chip 13b' may be determined according to the thickness of the semiconductor package 200.

Figure 3:
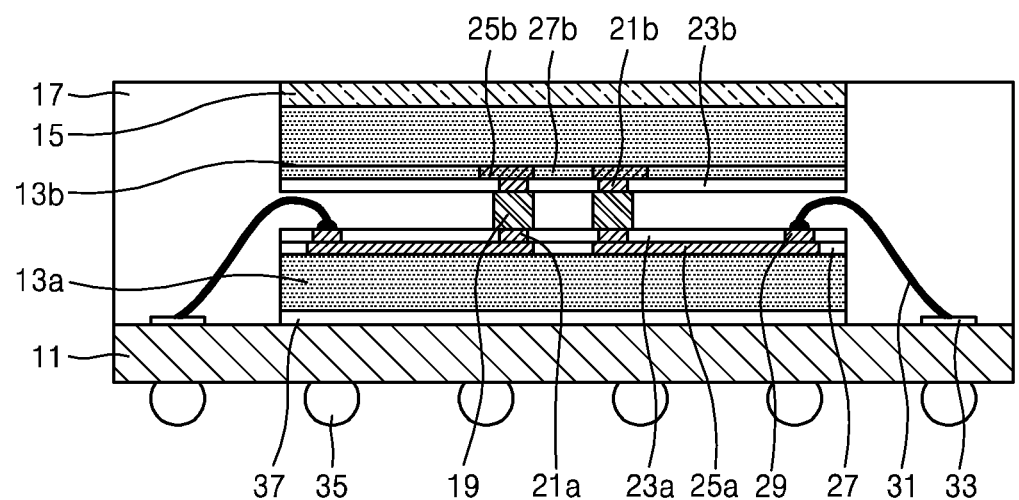

FIG. 3 is a cross-sectional view of the semiconductor package 300 according to an embodiment. The semiconductor package 300 is similar to the semiconductor package 100a of FIG. 1A. The first semiconductor chip 13a and the second semiconductor chip 13b, which are included in the semiconductor package 300 and the semiconductor package 100a, are the same, but the semiconductor package 300 and the semiconductor package 100a of FIG. 1A are different in that a second redistribution layer, which includes second redistribution lines 25b contacting the active surface of the second semiconductor chip 13b and an insulating layer 27b defining the second redistribution lines 25b, is further formed on the second semiconductor chip 13b.

Referring to FIG. 3, when the first semiconductor chip 13a and the second semiconductor chip 13b are of the same type, signals respectively corresponding to the first semiconductor chip 13a and the second semiconductor chip 13b when the first semiconductor chip 13a faces the second semiconductor chip 13b are mirror-symmetric. Therefore, the second redistribution layer, which includes the second redistribution lines 25b contacting the active surface of the second semiconductor chip 13b, may be formed so that the signals corresponding to the first semiconductor chip 13a and the second semiconductor chip 13b are transmitted. The second redistribution lines 25b may be electrically connected to an external circuit through the second bump pads 12b, the conductive bumps 19, the first bump pads 21a, the first redistribution lines 25a, the chip bonding pads 29, and the wires 31. In some embodiments, the semiconductor package 200 may have a mirror die package (MDP) structure for increased speed and high integration when used as mobile dynamic random access memory (mobile DRAM).

Figure 4:
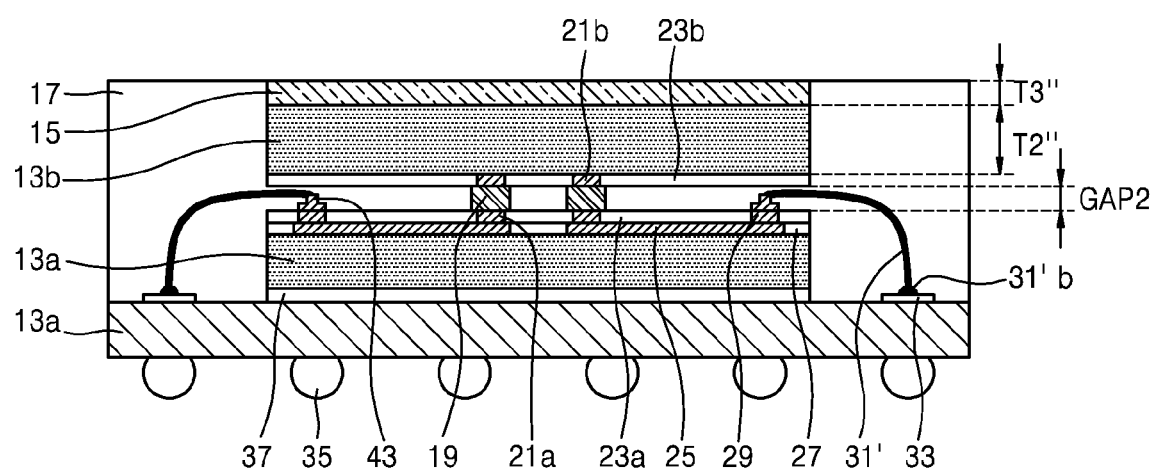

FIG. 4 is a cross-sectional view of the semiconductor package 400 according to an embodiment. The semiconductor package 400 is similar to the semiconductor package 100a of FIG. 1A except for shapes of the wires 31'. Referring back to FIG. 1A, the wires 31 may extend toward the substrate bonding pads 33 from the chip bonding pads 29. The wires 31 may be have a loop shape arched in an upward direction of the chip bonding pads 29. Due to the loop shape of the wires 31, the gap GAP1 between the first semiconductor chip 13a and the second semiconductor chip 13b may be limited to be in a certain range.

Referring to FIG. 4, the wires 31' may be formed through a reverse wire bonding method to extend and be connected to the chip bonding pad 29 from the ball-type bumps 31b formed on the substrate bonding pads 33. Stud bumps 43 may be further formed on the chip bonding pads 29, and the wires 31' may be connected to the stud bumps 43. In this case, the wires 31' may be connected to the stud bumps 43 through stitch bonding. Since the wires 31' extend toward the stud bumps 43 from the substrate bonding pads 33, the loop shape of the wires 31 may be small. Accordingly, a gap GAP 2 between the first semiconductor chip 13a and the second semiconductor chip 13b may be less than the gap GAP 1 of FIG. 1A. A space obtained as the gap GAP 2 between the first semiconductor chip 13a and the second semiconductor chip 13b is decreased may be used to increase a thickness T2'' of the second semiconductor chip 13b or a thickness T3'' of the lead 15, and thus, the deformation of the second semiconductor chip 13b may be prevented.

Figure 5:
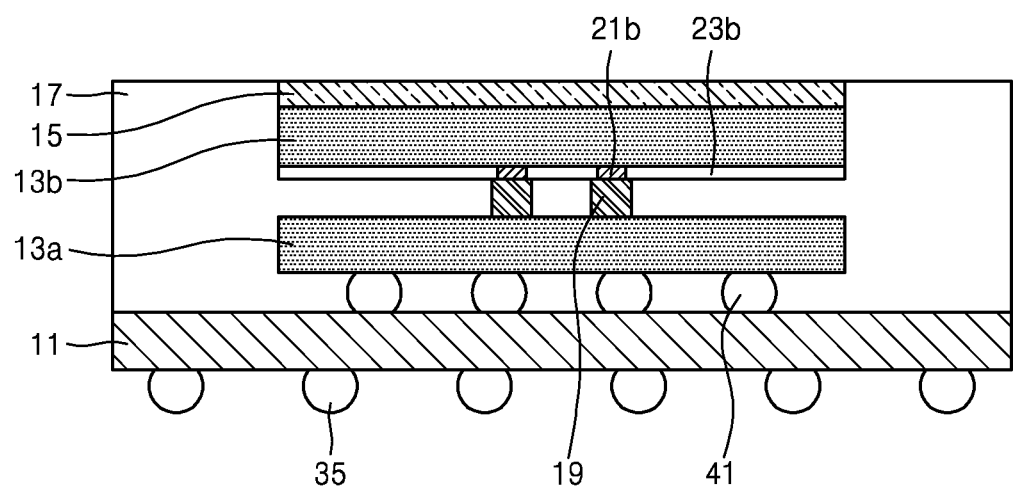

FIG. 5 is a cross-sectional via of a semiconductor package 500 according to an embodiment. The semiconductor package 500 may be similar to the semiconductor package of FIG. 1A except for the first semiconductor chip 13a not being connected to the substrate 11 through the wires 31. Referring to FIG. 5, the first semiconductor chip 13a may be flip-chip bonded to the substrate 11. Therefore, the active surface of the first semiconductor chip 13a may face the substrate 11. The active surface of the first semiconductor chip 13a may be electrically connected to the substrate 11 through connection members, for example, the conductive bumps 41. The second semiconductor chip 13b may be electrically connected to the internal wires of the first semiconductor chip 13a through, for example, a through silicon via (TSV). That is, the second semiconductor chip 13*b* may be connected to a TSV of the first semiconductor chip 13*a* through connection members, for example, the conductive bumps 41, and may be electrically connected to an external device through the solder balls 35 which are connected to a lower surface of the substrate 11.

As described above, to increase the speed and miniaturization of a semiconductor package, the thickness of the semiconductor package may be limited to a certain range. Accordingly, the thicknesses of a lower semiconductor chip and an upper semiconductor chip, which are included in a CoC semiconductor package, and/or a distance between the lower semiconductor chip and the upper semiconductor chip may be decreased. However, when the thickness of the upper semiconductor chip of the CoC semiconductor package is decreased, the upper semiconductor chip may be deformed, and thus, the lower semiconductor chip and the upper semiconductor chip may not be properly electrically connected to each other. Therefore, a thickness of a semiconductor package may be within a certain range in order to reduce or prevent the deformation of the lower semiconductor chip and the upper semiconductor chip. According to one or more embodiments, the semiconductor packages 100*a*, 100*b*, 100*c*, 200, 300, 400 and 500 of FIGS. 1A to 5 may reduce or prevent the deformation of the second semiconductor chip 13*b* by forming the leads 15, 15' and 15" thereon, thereby the semiconductor packages 100*a*, 100*b*, 100*c*, 200, 300, 400 and 500 having high driving reliability. Also, spaces where the leads 15, 15' and 15" are to be formed, may be secured by not using the molding member 17, and thus, the thicknesses of the semiconductor packages 100*a*, 100*b*, 100*c*, 200, 300, 400 and 500 may be maintained within a certain range. Accordingly, the demand for the miniaturization of the semiconductor package may be satisfied.

Figure 6A:
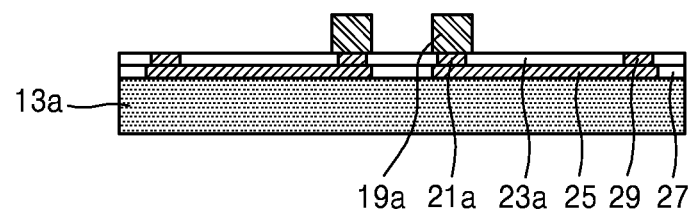
FIGS. 6A to 6E are cross-sectional views for explaining a method of manufacturing a semiconductor package according to an embodiment.

FIGS. 6A to 6E are cross-sectional views for explaining a method of manufacturing the semiconductor package 100*a* according to an embodiment. Referring to FIG. 6A, the first semiconductor chip 13*a* may be provided. The first semiconductor chip 13*a* may include an internal circuit (not shown). The first redistribution layer, which includes the first redistribution lines 25 and the insulating layer 23*a* defining the first redistribution lines 25, may be formed on the active surface of the first semiconductor chip 13*a* in order to transmit electrical signals of the second semiconductor chip 13*b* of FIG. 1A, which has the active surface facing the active surface of the first semiconductor chip 13*a*. The first pad layer, which includes the first bump pad 21*a* connected to the first redistribution lines 25, the chip bonding pads 29, and the insulating layer 23*a* defining the first bump pad 21*a* and the chip bonding pads 29, may be formed on the first redistribution layer. The first conductive bump 19*a* may be formed on the first bump pad 21*a* to be electrically connected to the first bump pad 21*a*.

Figure 6B:
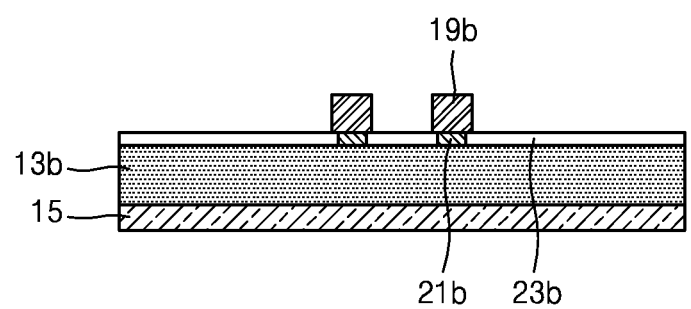

Referring to FIG. 6B, the second semiconductor chip 13*b* may be provided. The second pad layer, which includes the second bump pad 21*b* electrically connected to the active surface of the second semiconductor chip 13*b* and the insulating layer 23*b* defining the second bump pad 21*b*, may be formed on the second semiconductor chip 13*b*. A method of forming the second bump pad 21*b* is the same as the method of forming the first bump pad 21*a*. Then, the second conductive bump 19*b* which is electrically connected to the second bump pad 21*b* may be formed on the second bump pad 21*b*. The lead 15 may be attached to the lower surface of the second semiconductor chip 13*b* in order to prevent the deformation of the second semiconductor chip 13*b*. In this case, the lead 15 and the second semiconductor chip 13*b* may be bonded to each other through a bonding layer (not shown). In some embodiments, the lead 15 and the second semiconductor chip 13*b* may be bonded to each other via a die attach film (DAF).

The first conductive bump 19*a* and the second conductive bump 19*b*, which are described with reference to FIGS. 6A to 6B, may be electrically connected to each other. FIGS. 6A to 6B show that the first conductive bump 19*a* and the second conductive bump 19*b* are respectively formed on the first semiconductor chip 13*a* and the second semiconductor chip 13*b*, but any one of the first conductive bump 19*a* and the second conductive bump 19*b* may be formed. That is, a structure that may eventually become the conductive bumps 19 described above, may be formed by the first conductive bump 19*a*, the second conductive bump 19*b*, or a combination of the first conductive bump 19*a* and the second conductive bump 19*b*. In the following description, use of only the first conductive bump 19*a* will be used as an example; however, in other embodiments, different combinations of the first conductive bump 19*a* and the second conductive bump 19*b* may be used.

Figure 6C:
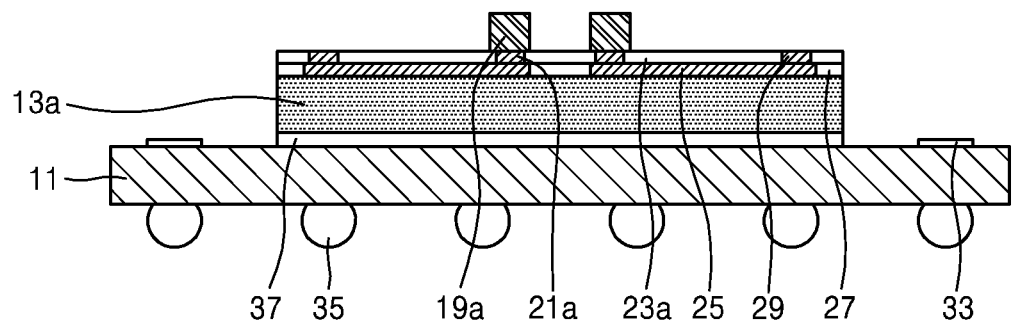

Referring to FIG. 6C, the first semiconductor chip 13*a* of FIG. 6A may be attached to the substrate 11 through the bonding layer 37. The substrate bonding pads 33, which may be connected to internal wires (not shown) of the substrate 11, may be formed on the upper surface of the substrate 11, and the solder balls 35, which may be connected to the internal wires (not shown), may be formed on the lower surface of the substrate 11.

Figure 6D:
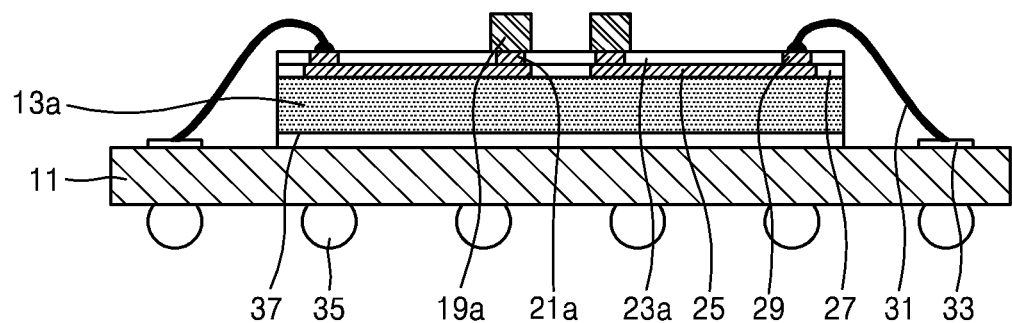

Referring to FIG. 6D, the chip bonding pads 29 formed on the first semiconductor chip 13*a* and the substrate bonding pads 33 formed on the substrate 11 may be electrically connected to each other through the wires 31 including conductive materials.

Figure 6E:
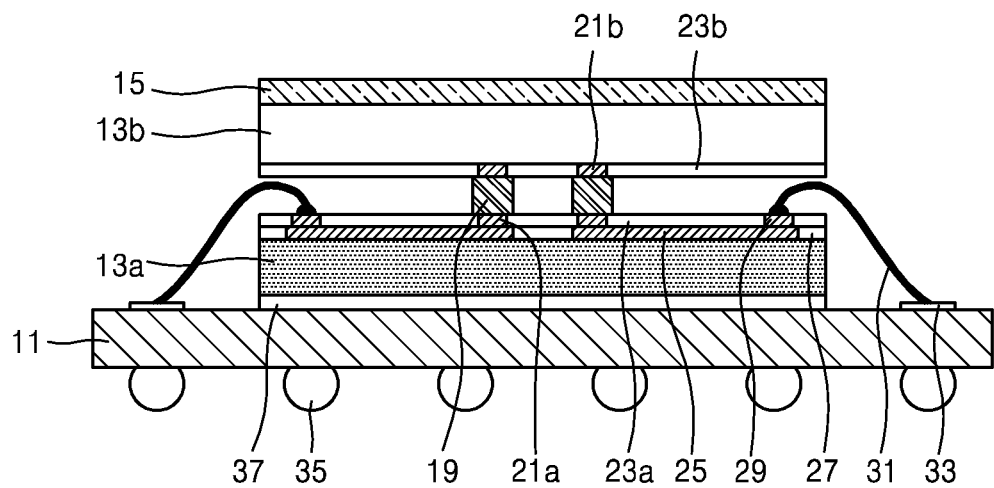

Referring to FIG. 6E, the second semiconductor chip 13*b* is arranged on the first semiconductor chip 13*a* in order to connect the first conductive bump 19*a* of FIG. 6D to the second conductive bump 19*b* of FIG. 6B. After the first conductive bump 19*a* and the second conductive bump 19*b* are arranged to be connected to each other, the first conductive bump 19*a* and the second conductive bump 19*b* are melted through a thermal treatment so that conductive bumps 19 may be formed.

Referring back to FIGS. 1A to 1C, the molding member 17 may be formed to cover the upper surface of the substrate 11 and the side surfaces 15S of the lead 15 of FIG. 6E and exposed portions of the substrate bonding pads 33, the wires 31, the bonding layer 37, the first semiconductor chip 13*a*, the redistribution layer, the first and second pad layers, the conductive bumps 19, and the second semiconductor chip 13*b*. In detail, a mold (not shown), having an internal space, is arranged on the substrate 11 in order to include a stack structure including the first semiconductor chip 13*a*, the second semiconductor chip 13*b*, etc., and a molding material may be injected into the internal space of the mold. In this case, a height of the stack structure including the first semiconductor chip 13*a*, the second semiconductor chip 13*b*, etc. may be the same as a vertical height of the internal space of the mold such that the molding member is not formed on the upper surface of the lead 15. As described above, the vertical space obtained by not forming the molding member on the upper surface of the lead 15 may be used to form the lead 15 or to increase a thickness of the second semiconductor chip 13*b*. Then, the mold is removed, and the semiconductor package 100*a* is manufactured by separating a wafer in a package unit.

Referring to FIGS. 6A to 6E, methods of manufacturing the semiconductor packages 100b, 100c, 200, 300, 400 and 500 of FIGS. 1B to 5 will be described.

In the semiconductor package 100b of FIG. 1B, the width L2b of the lead 15' may be less than the width L1 of the second semiconductor chip 13b. In this case, the molding member 17 may cover a portion of the upper surface of the second semiconductor chip 13b. A manufacturing procedure of the semiconductor package 100b is the same as that described with respect to FIGS. 6A to 6E.

Regarding the semiconductor package 100c of FIG. 1C, the width L2c of the lead 15" may be greater than the width L1 of the second semiconductor chip 13b. In this case, the molding member 17 may cover a portion of the lower surface of the lead 15". A manufacturing procedure of the semiconductor package 100c is the same as that described with respect to FIGS. 6A to 6E.

Regarding the semiconductor package 200 of FIG. 2, the second semiconductor chip 13b having an increased thickness may be formed in a space obtained by not forming the molding member 17 on the lead 15. A manufacturing procedure of the semiconductor package 200 is the same as that described with respect to FIGS. 6A to 6E.

The semiconductor package 300 of FIG. 3 is manufactured through a similar manufacturing procedure to that performed to manufacture the semiconductor package 100a of FIGS. 6A to 6E, except for a process for further forming the second redistribution layer which includes the second redistribution lines 25b, which are formed on the second semiconductor chip 13b, and the insulating layer 27b which defines the second redistribution lines 25b. That is, the semiconductor package 300 includes the first semiconductor chip 13a and the second semiconductor chip 13b which are the same type, and when the first semiconductor chip 13a and the second semiconductor chip 13b face each other, signals corresponding to the first semiconductor chip 13a are mirror-symmetric to signals corresponding to the second semiconductor chip 13b. Therefore, the second redistribution lines 25b and the insulating layer 27b which defines the second redistribution lines 25b may be formed on the upper surface of the second semiconductor chip 13b so that the signals corresponding to the first semiconductor chip 13a and the second semiconductor chip 13b are transmitted.

The semiconductor package 400 of FIG. 4 is manufactured through a similar manufacturing procedure to that performed to manufacture the semiconductor package 100a of FIGS. 6A to 6E, except for a process for forming the wires 31' of FIG. 4. The wires 31' included in the semiconductor package 400 of FIG. 4 may be formed through reverse wire bonding. Referring to FIG. 4, the wires 31' may be connected to the stud bumps 43, which are formed on the first semiconductor chip 13a, from the ball-type bumps 31'b.

The semiconductor package 500 of FIG. 5 is different from the semiconductor package 100a of FIGS. 6A to 6E in that the active surface of the first semiconductor chip 13a of FIG. 5 is connected to face the substrate 11. Connection members, for example, conductive bumps 41, are formed on an internal circuit of the first semiconductor chip 13a so that the internal circuit of the first semiconductor chip 13a and that of the substrate 11 are connected to each other. The second semiconductor chip 13b is arranged on the first semiconductor chip 13a such that the second semiconductor chip 13b is electrically connected to an internal circuit formed in a substrate (not shown) of the first semiconductor chip 13a. Then, the molding member 17 is formed to seal the upper surface of the substrate 11 and the side surfaces of the lead 15 and to expose the upper surface of the lead 15, and thus, the semiconductor package 500 may be manufactured.

Figure 7:
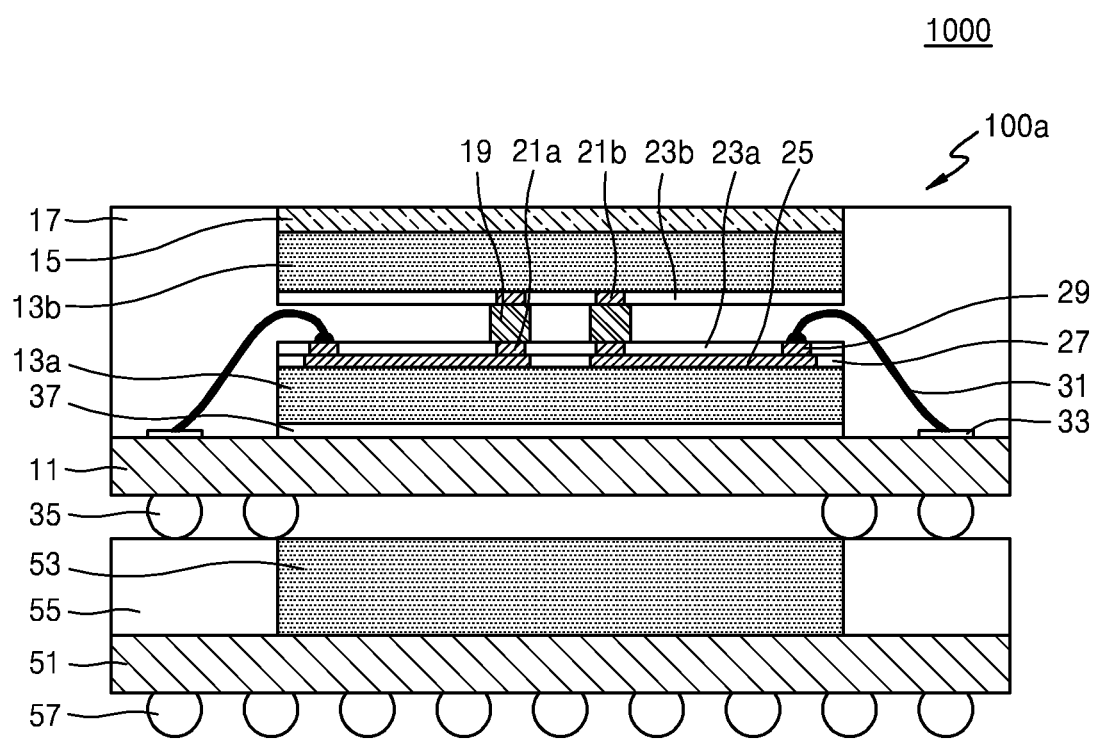
FIG. 7 is a cross-sectional view of a semiconductor package according to an embodiment.

FIG. 7 is a cross-sectional view of a semiconductor package 1000 according to an embodiment. FIG. 7 shows the PoP-type semiconductor package 1000 including the semiconductor package 100 of FIG. 1A. That is, the PoP-type semiconductor package 1000 may include the semiconductor package 100a. Using memory chips as an example, in this embodiment, the semiconductor package 100a includes the first memory chip 13a arranged on the substrate 11, the second memory chip 13b arranged on the first memory chip 13a, the lead 15 attached to the second memory chip 13b in order to prevent the bending of the second memory chip 13b, and the molding member 17 covering the upper surface of the substrate 11 and the side surfaces of the lead 15 and seals the first memory chip 13a and the second memory chip 13b. The semiconductor package 100a may be a memory package and may include a system semiconductor package which includes a logic chip 53 arranged on a system semiconductor substrate 51 and a molding member 55 which covers an upper surface of the system semiconductor substrate 51 and the logic chip 53. In this case, the semiconductor package 100a and the system semiconductor package have stack structures. The second semiconductor chip 13b may be deformed because a thickness of each of the first and second semiconductor chips 13a and 13b is decreased to manufacture the PoP-type semiconductor package 1000. However, the deformation of the second semiconductor chip 13b may be reduced or prevented by attaching the lead 15 onto the second semiconductor chip 13b, and thus, the reliability of an electrical connection of the second semiconductor chip 13b to the first semiconductor chip 13a may be secured. Also, a space may be secured in a vertical direction by not forming the molding member 17 on the second semiconductor chip 13b, and thus, the thickness of the second semiconductor chip 13b is not increased although the lead 15 is attached. In addition, because of the space obtained in a vertical direction by not forming the molding member 17 on the second semiconductor chip 13b, the thickness of the semiconductor package 1000 is not increased although the lead 15 is formed. In addition, the thickness of the second semiconductor chip 13b may be increased.

FIG. 7 shows that the PoP-type semiconductor package 1000 includes the semiconductor package 100a of FIG. 1A, but embodiments are not limited thereto. A semiconductor package according to one or more embodiments may be a PoP-type semiconductor package including one or more of the semiconductor packages 100a, 100b, 100c, 200, 300, 400, and 500 of FIGS. 1A to 5. In some embodiments, the semiconductor package 1000 may be a semiconductor package including one or more of the semiconductor packages 100a, 100b, 100c, 200, 300, 400, and 500 of FIGS. 1A to 5 and another semiconductor package or other semiconductor chips mounted in a horizontal direction.

Figure 8:
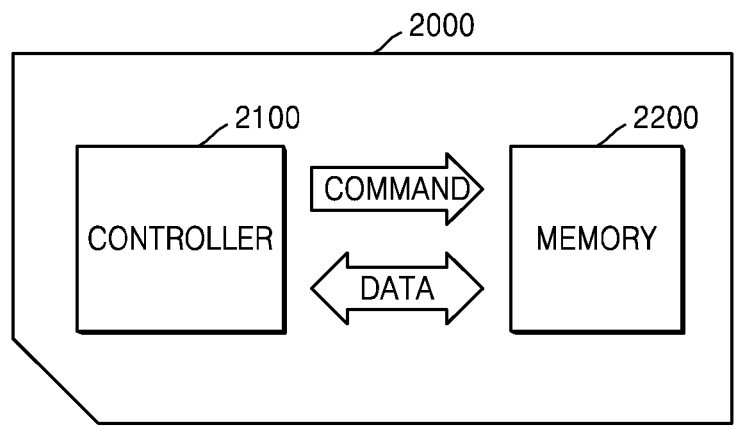
FIG. 8 is a schematic block diagram of a memory card including semiconductor packages according to some embodiments.

FIG. 8 is a schematic block diagram of a memory card 2000 including the semiconductor packages according to some embodiments. Referring to FIG. 8, a controller 2100 and a memory 2200 included in the memory card 2000 may be arranged to exchange electrical signals with each other. For example, when the controller 2100 sends commands to the memory 2200, and the memory 2200 may transmit data to the controller 2100. The controller 2100 and/or the memory 2200 may include one or more of the semiconductor packages 100a, 100b, 100c, 200, 300, 400, and 500 of FIGS. 1A to 5. The memory 2200 may include a memory array (not shown) or a memory array bank (not shown).

The memory card 2000 may be used for a memory device such as a memory stick card, a smart media card (SM), a secure digital (SD) card, a mini SD card, a multimedia card (MMC), or the like.

Figure 9:
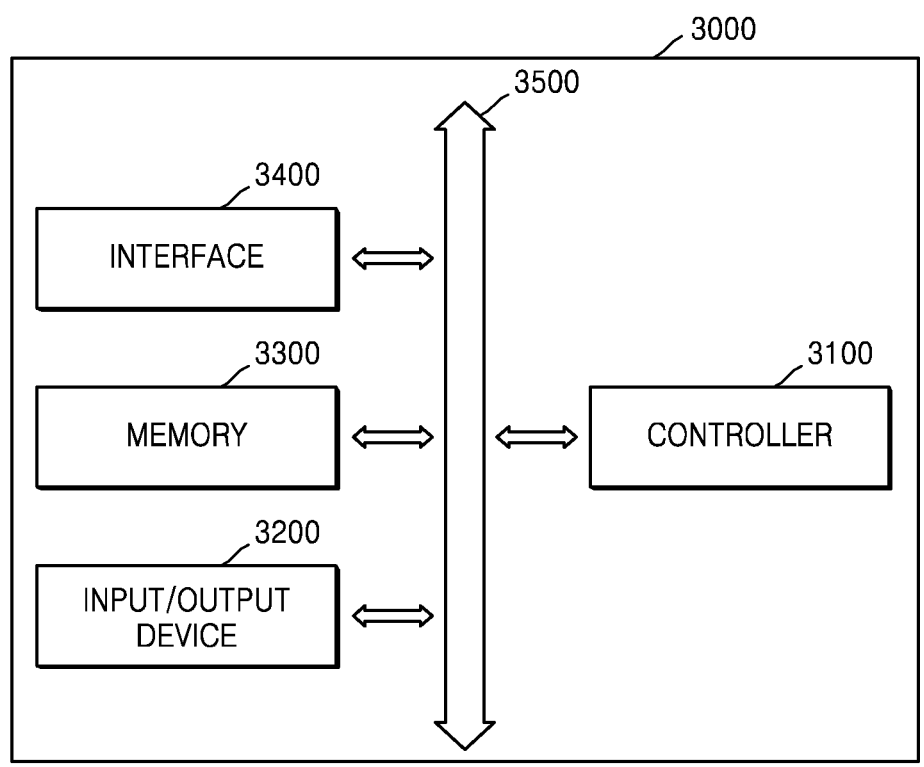
FIG. 9 is a schematic block diagram of an electronic system including semiconductor packages, according to an embodiment.

FIG. 9 is a schematic block diagram of an electronic system 3000 including the semiconductor packages according to some embodiments. Referring to FIG. 9, the electronic system 3000 may include a controller 3100, an input/output device 3200, a memory 3300, and an interface 3400. The electronic system 3000 may be a mobile system or a system which transmits or receives information. The mobile system may be a personal digital assistant (PDA), a portable computer (PC), a web tablet, a wireless phone, a mobile phone, a digital music player, a memory card, or the like.

The controller 3100 may be configured to execute programs and may control the electronic system 3000. The controller 3100 may include one or more of the semiconductor packages 100a, 100b, 100c, 200, 300, 400, and 500 of FIGS. 1A to 5. Accordingly, the controller 3100 may be, for example, a microprocessor, a digital signal processor, a microcontroller, or the like. The input/output device 3200 may be configured to be used to input or output data of the electronic system 3000.

The electronic system 3000 is configured to use the input/output device 3200 in order to be connected to an external device, for example, a PC or network, and may exchange data with the external device. The input/output device 3200 may be, for example, a keypad, a keyboard, or a display. The input/output device 3200 may include one or more of the semiconductor packages 100a, 100b, 100c, 200, 300, 400, and 500 of FIGS. 1A to 5.

The memory 3300 may be configured to store codes and/or data used to operate the controller 3100 and/or may be configured to store data processed by the controller 3100. The memory 3300 may include one or more of the semiconductor packages 100a, 100b, 100c, 200, 300, 400, and 500 of FIGS. 1A to 5. The interface 3400 may be a data transmission path disposed between the electronic system 3000 and another external device. The controller 3100, the input/output device 3200, the memory 3300, and the interface 3400 may communicate with each other via a bus 3500. The interface 3400 may include one or more of the semiconductor packages 100a, 100b, 100c, 200, 300, 400, and 500 of FIGS. 1A to 5.

In some embodiments, the electronic system 3000 including one or more of the semiconductor packages 100a, 100b, 100c, 200, 300, 400, and 500 of FIGS. 1A to 5 may be applied to a mobile phone, a portable laptop, an MP3 player, a navigation device, a portable multimedia player (PMP), a solid state disk (SSD), a vehicle, household appliances, or the like.

Figure 10:
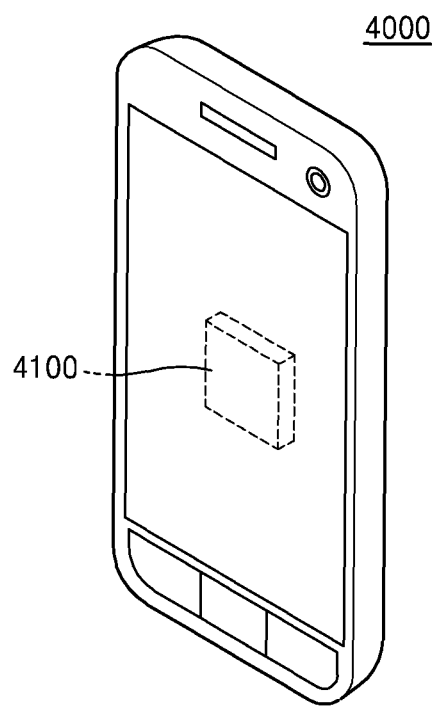
FIG. 10 is a schematic cross-sectional view of an electronic system including a semiconductor package, according to an embodiment.

FIG. 10 is a schematic cross-sectional view of an electronic system including a semiconductor package, according to an embodiment. FIG. 10 shows that the electronic system 3000 of FIG. 9 is used in a mobile phone 4000. Here, the electronic system 3000 is represented by electronic system 4100 of the mobile phone 4000. The electronic system 4100 includes one or more of the semiconductor packages 100a, 100b, 100c, 200, 300, 400 and 500 of FIGS. 1A through 5.

An embodiment includes a semiconductor package having a structure with reduced thickness and preventing deformation of semiconductor chips mounted therein, a package-on-package (PoP) device including the semiconductor package, and a mobile device including the semiconductor package.

An embodiment includes a semiconductor package, a PoP device including the semiconductor package, and a mobile device including the semiconductor package. According to an aspect, there is provided a semiconductor package including a substrate, a first semiconductor chip which is arranged on the substrate, a second semiconductor chip which is arranged on the first semiconductor chip, a lead which is attached to the second semiconductor chip in order to prevent bending of the second semiconductor chip and a molding member which covers an upper surface of the substrate and side surfaces of the lead and seals the first semiconductor chip and the second semiconductor chip.

An embodiment includes a bearing including an electromagnet including a core, a plurality of coils connected in parallel, and at least one first cooling device, wherein the coils are wound around the core and arranged in a direction perpendicular to a winding direction thereof, and the first cooling device is disposed between the coils and a controller detecting a distance between the electromagnet and an object facing a magnetic pole of the electromagnet and controlling a current supplied to the electromagnet according to the distance.

An embodiment includes a mobile device including the semiconductor package

While embodiments have been particularly shown and described with reference to exemplary embodiments thereof, it will be understood that various changes in form and details may be made therein without departing from the spirit and scope of the following claims.

What is claimed is:

1. A package-on-package device comprising:
a memory package comprising:
a first semiconductor chip arranged on a substrate;
a second semiconductor chip arranged on the first semiconductor chip;
a lead attached to the second semiconductor chip on a side of the second semiconductor chip opposite a side of the second semiconductor chip facing the first semiconductor chip; and
a molding member covering an upper surface of the substrate and side surfaces of the lead and sealing the first semiconductor chip and the second semiconductor chip;
a system semiconductor package comprising a logic chip arranged on a system semiconductor substrate; and
a semiconductor package having a structure in which the memory package and the system semiconductor package are stacked.

2. The package-on-package device of claim 1, wherein an upper surface of the lead is not covered by the molding member.

3. A semiconductor package comprising:
a substrate;
a first semiconductor chip stacked on the substrate;
a second semiconductor chip stacked on the first semiconductor chip and electrically coupled to the first semiconductor chip;
a molding member disposed between the first semiconductor chip and the second semiconductor chip; and
a lead stacked on the second semiconductor chip on a side of the second semiconductor chip opposite the molding member;
wherein a width of the lead is less than that of the second semiconductor chip.

4. The semiconductor package of claim 3, wherein the lead comprises a metal.

5. The semiconductor package of claim 3, wherein the lead is more rigid than the second semiconductor chip.

\* \* \* \* \*